United States Patent [19]

Cragfors et al.

[11] 4,390,846
[45] Jun. 28, 1983

[54] POWER AMPLIFIER CONNECTION

[75] Inventors: Gunnar Cragfors; Jörgen Bosson, both of Västerås, Sweden

[73] Assignee: ASEA Aktiebolag, Västerås, Sweden

[21] Appl. No.: 226,995

[22] Filed: Jan. 21, 1981

[30] Foreign Application Priority Data

Jan. 28, 1980 [SE] Sweden ............................ 8000633

[51] Int. Cl.³ .............................................. H03F 3/68
[52] U.S. Cl. ................................. 330/10; 330/124 R; 330/207 A
[58] Field of Search ................. 330/10, 124 R, 207 A, 330/84, 251

[56] References Cited

U.S. PATENT DOCUMENTS 3,783,399 1/1974 Black ...................................... 330/10

FOREIGN PATENT DOCUMENTS 421103 11/1970 U.S.S.R. ............................. 330/84

Primary Examiner—James B. Mullins
Assistant Examiner—Gene Wan
Attorney, Agent, or Firm—Pollock, Vande Sande & Priddy

[57] ABSTRACT

A power amplifier connection comprises a switching amplifier and a proportional amplifier. The output signal from the switching amplifier and the output signal from the proportional amplifier are supplied to a summation member which, by addition of the two output signals, forms the resultant output signal of the amplifier connection. The switching amplifier is adapted to be controlled in dependence on the input signal of the amplifier connection in such a way that its output signal endeavours to follow the input signal. The proportional amplifier is adapted to be controlled in dependence on the deviation between the input signal and output signal of the amplifier connection.

5 Claims, 4 Drawing Figures

POWER AMPLIFIER CONNECTION

TECHNICAL FIELD

This invention relates to a power amplifier connection with feed-back.

BACKGROUND ART

It has previously been proposed to construct a power amplifier as a switching amplifier. The output terminal of such an amplifier may be connected by way of two switching members, for example switching transistors, to either of two supply voltages, for example a positive and a negative voltage. The switching members are made alternately conducting with a relatively high switching frequency. By modulating the pulse-length of the output signal thus obtained, its mean value may be controlled in dependence on the input signal to the amplifier. In order to reduce the amplitude of the alternating voltage component caused by the switching, a filter, for example an LC filter, is arranged between the switching members and the output of the amplifier. The more efficient the filter is made, the smaller will be the band width of the amplifier, and in practice the filter is dimensioned so that a suitable compromise is obtained between the contrasting desires of an efficient filtering and a large band width. An amplifier of this kind has low losses but has the disadvantage that it is impossible simultaneously to obtain a large band width and a small ripple on the output signal.

The present invention aims to provide a power amplifier connected in which a small ripple of the output signal as well as a large band width may be obtained, and in which at the same time the losses are low.

DISCLOSURE OF THE INVENTION

According to the invention, a power amplifier connection comprises a switching amplifier providing a first output signal, a proportional amplifier providing a second output signal, means for summing said first and second output signals to form said amplified output signal, means for controlling said switching amplifier in dependence on said input signal to the amplifier connection in such a way that said amplified output signal endeavours to follow said input signal, and means for controlling said proportional amplifier in dependence on the deviation between said input signal and said amplified output signal.

BRIEF DESCRIPTION OF DRAWINGS

The invention will now be described, by way of example, with reference to the accompanying drawings, in which.

DESCRIPTION OF PREFERRED EMBODIMENTS

Figure 1:
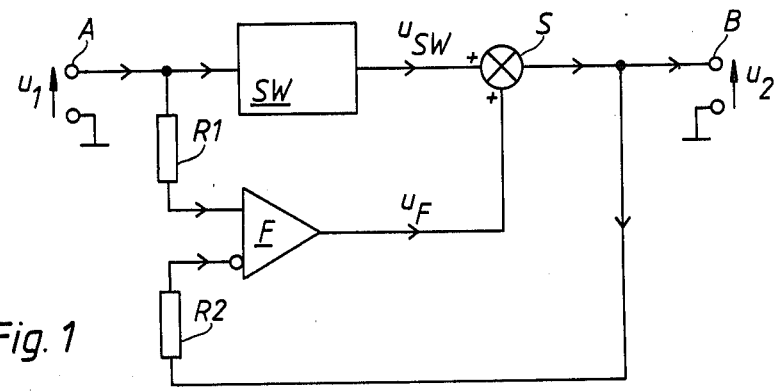
FIG. 1 is a circuit diagram of a first embodiment of an amplifier connection in accordance with the invention, in which the switching amplifier is directly controlled by the input signal of the amplifier connection.

The amplifier connection shown in FIG. 1 has an input terminal A and an output terminal B. An input signal $u_1$ is supplied to the input terminal A, and the output signal $u_2$ of the amplifier connection appears at the output terminal B. The input signal $u_1$ is supplied to a switching amplifier SW, which may be of the same kind as the switching amplifier described hereinafter with reference to FIGS. 2 and 3. The input signal $u_1$ controls the output signal $u_{SW}$ of the switching amplifier so that its mean value endeavours to follow the input signal, that is, to be proportional to the input signal. The output signal $u_{SW}$ of the amplifier SW is supplied to a summation member S. A proportional amplifier F, for example a conventional transistor amplifier with high gain, delivers an output signal $u_F$ which is added in the summation member S to the signal $u_{SW}$, to produce the output signal $u_2$ of the amplifier connection. The input signal $u_1$ and the output signal $u_2$ are supplied via resistors R1 and R2, respectively, to inputs of the amplifier F with opposite polarities. The output signal $u_F$ of the amplifier F therefore, in a known manner, becomes proportional to the difference $$\frac{u_1}{R1} - \frac{u_2}{R2}$$

The gain of the amplifier F is suitably high, and the above noted difference then becomes almost equal to zero. The amplifier F therefore delivers, at each moment, an output signal $u_F$ of such a magnitude that $$u_2 \approx u_{SW} + u_F = u_1 \cdot \frac{R2}{R1}$$

Therefore, at each moment, the output signal $u_2$ of the amplifier connection will be proportional to the input signal $u_1$.

The amplifier F thus compensates for the deviations from the desired proportionality that exist between the output signal $u_{SW}$ of the switching amplifier and the input signal $u_1$ and which, among other things, are due to the high-frequency component in the signal $u_{SW}$, caused by the switching in the amplifier SW.

Since the proportional amplifier F need only take care of deviations from the exact proportionality of the signal $u_{SW}$, the main part of the output power of the amplifier connection, upon a suitable dimensioning, will be delivered by the switching amplifier SW, which has low losses. Only a minor portion of the output power needs to be delivered by the proportional amplifier F. Compared with a connection having only a switching amplifier, a considerable reduction of the harmonic content of the output voltage can be obtained with a slight increase of the losses in the case of unchanged band width, or alternatively, with the same harmonic content, a considerable increase of the band width can be obtained.

Figure 2:
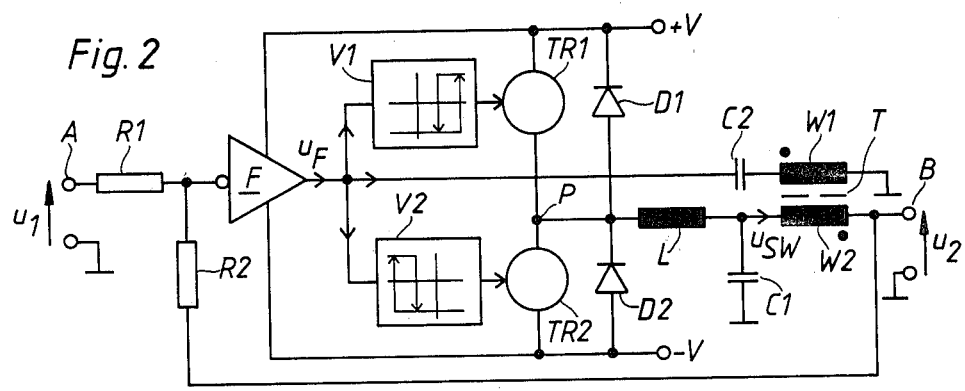
FIG. 2 is a circuit diagram of a second embodiment of an amplifier connection in accordance with the invention, in which the switching amplifier is controlled by the output signal of the proportional amplifier, the output voltages of the proportional amplifier and the switching amplifier being added to form the output voltage of the amplifier connection.

In the power amplifier connection illustrated in FIG. 2, the switching amplifier SW is shown in more detail. It consists of two switching transistors TR1 and TR2, which are connected in series with each other between the supply voltages $+V$ and $-V$ of the amplifier connection. Each of the transistors TR1 and TR2 is antiparallel-connected to a freewheeling diode D1 and D2, respectively. The transistors are switched on and off with a relatively high frequency. The voltage at the point of connection P of the transistors will therefore vary between the values $+V$ and $-V$. This voltage has a mean value which substantially follows the input signal $u_1$ of the amplifier connection, and an alternating voltage component of relatively high frequency superimposed on the mean value. In order to reduce this component, the switching amplifier has an LC filter consisting of an inductor L and a capacitor C1. In the output voltage $u_{SW}$ from this LC filter the alternating voltage component is considerably reduced in amplitude. For control of the two switching transistors TR1 and TR2, the switching amplifier comprises two level flip-flops V1 and V2, to which the output signal $u_F$ from the proportional amplifier F is fed. The flip-flop V1 has a certain hysteresis and its switch-on level is higher than its switch-off level. When the input signal $u_F$ of the flip-flop V1 reaches the switch-on level, the output signal of the flip-flop becomes "1" and the transistor TR1 is switched on. As will be described hereinafter, the signal $u_F$ then tends to drop, and when it has dropped to the switch-off level, the transistor TR1 is switched off. The corresponding operation, but for negative values of the signal $u_F$, applies to the flip-flop V2 and the transistor TR2.

The output signal $u_{SW}$ of the switching amplifier is fed to the output B of the amplifier connection via a secondary winding W2 of a transformer T. This transformer constitutes a summation member for summing the output voltage $u_{SW}$ from the switching amplifier and the output voltage $u_F$ from the proportional amplifier F. The voltage $u_F$ is supplied to the primary winding W1 of the transformer T via a capacitor C2, which blocks the low-frequency component in the voltage $u_F$. The transformer core is suitably provided with an air gap and dimensioned so as not to be driven into saturation by the low-frequency component of the load current (which substantially flows through the winding W2).

The connection is preferably dimensioned in such a way that the switching amplifier delivers the main portion and the proportional amplifier only a minor portion of the output power of the amplifier connection. In the embodiment according to FIG. 2 the switching amplifier and the proportional amplifier are fed from the same supply voltages $+V$ and $-V$. By selecting the transformation ratio of the transformer T such that the number of turns of the winding W1 is greater than that of the winding W2 (for example, in the ratio 20:1), the load current of the amplifier F and thus its rated power will become small compared with the total current and rated power, respectively, of the amplifier connection. In this way, the power losses in the amplifier F will also be small.

The mode of operation of the connection is as follows. The gain of the amplifier F is assumed to be great, and the amplifier therefore delivers such an output signal that, at each moment, $u_2 = u_1$. The signal $u_F$ is therefore, at each moment, $u_F = u_2 - u_{SW}$. If all the signals are assumed to be positive at a certain moment and the transistors TR1 and TR2 are both assumed to be switched off, the signal $u_{SW}$ will tend to decrease, which because of the feedback results in an increase of the signal $u_F$. When the signal $u_F$ reaches the switch-on level of the flip-flop V1, the transistor TR1 is switched on and connects the point P to the supply voltage $+V$. An increasing current is then driven through the inductor L, and the signal $u_{SW}$ will successively increase. This leads to a decrease of the signal $u_F$. When the signal $u_F$ has reached the switch-off level of the flip-flop V1, the transistor TR1 is switched off. The current through the inductor L and successively also the signal $u_{SW}$ will then diminish, whereby the signal $u_F$ increases, and when the switch-off level of the flip-flop V1 has been attained the transistor TR1 is switched on again.

In a corresponding manner, the transistor TR2 is switched on as soon as the signal $u_F$ reaches such a negative value that the switch-on level of the flip-flop V2 is attained.

In the embodiment of FIG. 2, the switching amplifier is comprised in the control loop and will always be automatically activated as soon as the share $(u_2 - u_{SW})$ of the amplifier F in the output voltage $u_2$ reaches a portion of the output voltage determined by the transformation ratio of the transformer T and the switch-on levels of the flip-flops V1 and V2, for example a few percent of the output voltage. The mean value of the output signal $u_{SW}$ of the switching amplifier will substantially follow (i.e. it will be proportional to) the input signal $u_1$ of the amplifier connection. The deviations between the desired output signal $$u_2 = u_1 \cdot \frac{R2}{R1}$$

and the output signal $u_{SW}$ of the pulsed amplifier are dealt with by the amplifier F.

Figure 3:
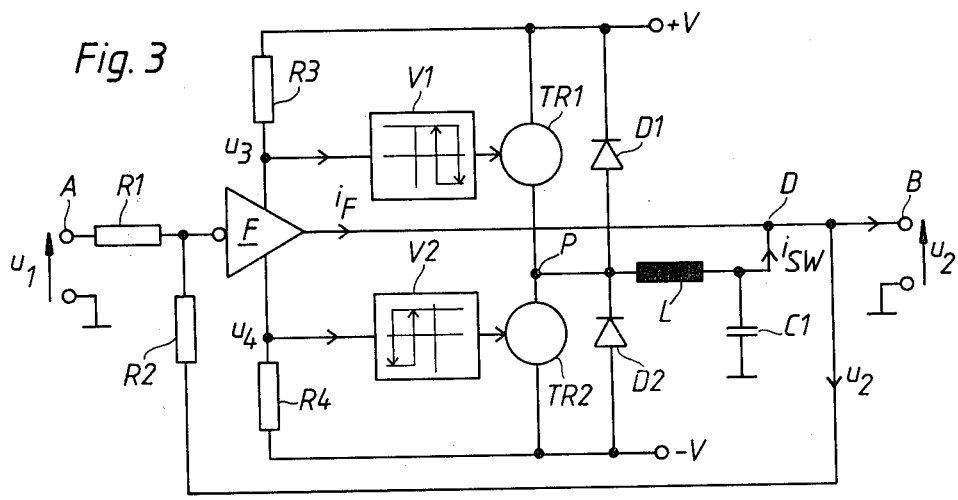
FIG. 3 is a circuit diagram of a third embodiment of an amplifier connection in accordance with the invention, in which the switching amplifier is controlled by the output signal of the proportional amplifier, the summation of the output signals of the two amplifiers taking place by current addition.

The embodiment shown in FIG. 3 differs from that shown in FIG. 2 in that the currents of the switching amplifier and the proportional amplifier are added (instead of the output voltages, as in FIG. 2). This addition is made by supplying the currents ($i_F$ and $i_{SW}$, respectively) to a connection point D which serves as a summation member. The transistors TR1 and TR2 of the switching amplifier are controlled by flip-flops V1 and V2 which switch in the respective transistor when the absolute value of the input voltage drops below a predetermined switch-on level, and switches off the transistor when the absolute value rises above a switch-off level which is higher than the switch-on level. The amplifier F is fed from the supply voltages via two measuring resistors R3 and R4. The voltages $u_3$ and $u_4$ thus constitute a measure of the supply current of the amplifier F and thus of its output current $i_F$.

The amplifier F senses, as in the embodiment of FIG. 2, the difference $u_2 - u_1$, and delivers such a current to a load (not shown) connected to the terminal B that the output voltage $u_2$ follows the value $$u_1 \cdot \frac{R2}{R1}$$

with great accuracy. If the current of the amplifier F exceeds a value determined by the switch-on levels of the flip-flops V1 and V2 and by the resistors R3 and R4, one of the transistors TR1 and TR2 is switched on and gives an increasing current $i_{SW}$ which is added to the current $i_F$. The latter current will then decrease, and the switched-on transistor is switched off when the input signal to the flip-flop reaches the switch-off level. In the same way as in the embodiment of FIG. 2, the switching amplifier is here included in the control loop and it will provide the major part of the current that is required for the output voltage $u_2$ to follow the input voltage $u_1$. The connection is dimensioned such that the amplifier F, which primarily compensates for the high frequency component in the output signal, caused by the pulsing of the transistors, only needs to deliver a minor part of the output power of the connection.

Figure 4:
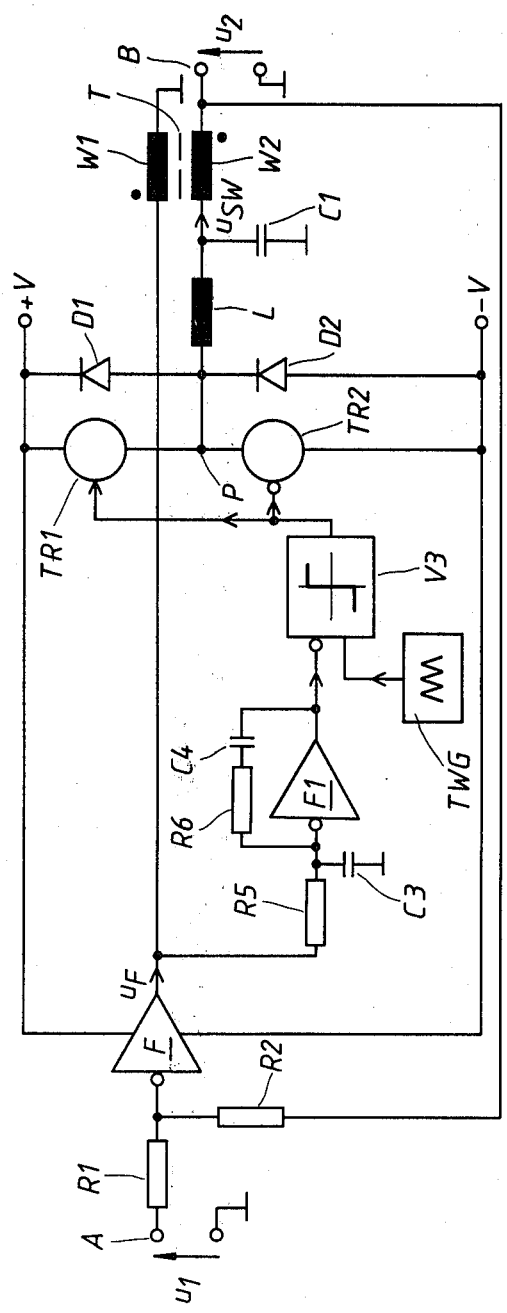
FIG. 4 is a circuit diagram of a fourth embodiment of an amplifier connection in accordance with the invention, in which the operating frequency of the switching amplifier is constant.

The embodiment shown in FIG. 4 corresponds in its essential features with the amplifier connection according to FIG. 2. The control of the transistors TR1 and TR2 is, however, performed in a different way. The output signal $u_F$ of the amplifier F is supplied to a low-pass filter circuit which consists of a resistor R5 and a capacitor C3 and in which part of the high frequency ripple in the signal is filtered out. The filtered signal is supplied to an integrator having a PI function, which consists of an amplifier F1, a resistor R6 and a capacitor C4. The output signal of the integrator, which is a measure of the low frequency component of the signal $u_F$, is supplied to an inverting input of a level-flip-flop V3. To a second input of the flip-flop V3 is fed the output signal from a sawtooth wave generator TWG. The output signal of the flip-flop V3 is supplied to the control connections of the transistor TR1 and—with inverted sign—of the transistor TR2. The flip-flop V3 compares the low frequency component of the signal $u_F$ with the sawtooth wave from the generator TWG and in this way influences the switching times between the transistors TR1 and TR2, and thus the relationship between their conduction intervals and the mean value of the output voltage $u_{SW}$ from the switching amplifier. The operating frequency of this amplifier is determined by the generator TWG and is suitably held constant at a desired value. At a frequency of the voltages $u_1$ and $u_2$ of, for example, 100 Hz, a frequency of about 20 kHz has been used for the generator TWG. The amplifier connection shown in FIG. 4 functions extremely well within a large range of variation of the load current. The control principle shown in FIG. 4 may—mutatis mutandis—be employed with the amplifier connection shown in FIG. 3 as well.

As is clear from the above description, the invention provides an amplifier connection involving simultaneously low losses, a large band width, and a ripple-free output voltage.

In the embodiments shown in FIGS. 2 to 4, the switching amplifier forms part of the control loop. This involves advantages from the point of view of regulation, and furthermore the output power from the proportional amplifier is automatically limited. Furthermore, in these embodiments the control equipment of the switching amplifier is extremely simple.

In FIGS. 2 to 4 the two amplifiers are fed from a common supply voltage source. Alternatively, the amplifiers may have different supply voltages, in which case the proportional amplifier preferably has a lower supply voltage than the switching amplifier. However, the proportional amplifier should always have such a high supply voltage that it is able to deliver an output voltage which is somewhat greater than the ripple in the output signal from the switching amplifier.

What is claimed is:

1. A power amplifier connection for converting an AC input signal into an amplifier AC output signal, said connection comprising:
   a constant amplitude pulse width modulated switching amplifier providing a first output signal,
   a proportional amplifier providing a second output signal,
   means for summing said first and second output signals to form said amplifier AC output signal,
   means for controlling said switching amplifier in dependence on said input signal to the amplifier connection so that said amplifier AC output signal substantially follows said input signal, and
   means for controlling said proportional amplifier in dependence on the deviation between said AC input signal and said AC amplified output signal.

2. A power amplifier connection according to claim 1 comprising means for supplying said input signal to said switching amplifier for controlling the latter.

3. A power amplifier connection according to claim 1, comprising means for supplying said second output signal to said switching amplifier for controlling the latter.

4. A power amplifier connection according to claim 1, in which said switching amplifier comprises level-sensing control means for activating switching means of said switching amplifier as soon as said second output signal reaches a predetermined level.

5. A power amplifier connection according to claim 3, in which said switching amplifier comprises control means having an integrating amplifier providing an output signal, which integrating amplifier is supplied with said second output signal, and having comparison means to compare said output signal of said integrating amplifier with the output signal from a sawtooth wave generator for control of the switching times of said switching amplifier.

* * * * *